(12) United States Patent
Deng

(10) Patent No.: US 10,002,944 B2
(45) Date of Patent: Jun. 19, 2018

(54) SEMICONDUCTOR STRUCTURE

(71) Applicant: Semiconductor Manufacturing International (Shanghai) Corporation, Shanghai (CN)

(72) Inventor: Hao Deng, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days. days.

(21) Appl. No.: 15/645,013

(22) Filed: Jul. 10, 2017

(65) Prior Publication Data
US 2017/0373169 A1     Dec. 28, 2017

Related U.S. Application Data

(62) Division of application No. 14/970,881, filed on Dec. 16, 2015, now Pat. No. 9,735,251.

(30) Foreign Application Priority Data

Dec. 19, 2014    (CN) .......................... 2014 1 0820226

(51) Int. Cl.
| | |
|---|---|
| *H01L 21/02* | (2006.01) |
| *H01L 29/66* | (2006.01) |
| *H01L 21/306* | (2006.01) |
| *H01L 21/768* | (2006.01) |

(Continued)

(52) U.S. Cl.
CPC .. *H01L 29/66545* (2013.01); *H01L 21/30604* (2013.01); *H01L 21/30625* (2013.01); *H01L 21/31116* (2013.01); *H01L 21/76829* (2013.01); *H01L 21/76834* (2013.01); *H01L 21/76897* (2013.01); *H01L 29/7833* (2013.01); *H01L 2924/0002* (2013.01)

(58) Field of Classification Search
CPC ........... H01L 21/31116; H01L 21/2253; H01L 21/30604; H01L 21/30625
See application file for complete search history.

(56) References Cited

U.S. PATENT DOCUMENTS

| | | | |
|---|---|---|---|
| 2010/0270627 A1* | 10/2010 | Chang ............... | H01L 21/28247 257/411 |
| 2013/0181265 A1 | 7/2013 | Grasshoff et al. | |
| 2015/0021672 A1 | 1/2015 | Chuang et al. | |

(Continued)

*Primary Examiner* — Stephen Bradley
*Assistant Examiner* — Wasiul Haider
(74) *Attorney, Agent, or Firm* — Anova Law Group, PLLC

(57) ABSTRACT

A method for forming a semiconductor structure includes providing a semiconductor substrate having a metal gate structure formed on the semiconductor substrate; forming a first dielectric layer covering a side surface of the metal gate structure on the semiconductor substrate; forming a cap layer on the metal gate structure; etching a top portion of the first dielectric layer using the cap layer as an etching mask; forming a protective sidewall spacer on a side surface of the cap layer and a side surface of a portion of the first dielectric layer under the cap layer; forming a second dielectric layer to cover the cap layer, the protective sidewall spacer and a top surface of the etched first dielectric layer; forming at least a first through-hole in the second dielectric layer; and forming a first conductive via in the first through-hole.

6 Claims, 5 Drawing Sheets

(51) Int. Cl.
*H01L 21/311* (2006.01)
*H01L 29/78* (2006.01)

(56) References Cited

U.S. PATENT DOCUMENTS

2015/0243773 A1   8/2015  Basu et al.
2016/0043186 A1*  2/2016  Liu .................... H01L 29/6656
                                                             257/401
2016/0071947 A1   3/2016  Wiatr et al.

* cited by examiner

SEMICONDUCTOR STRUCTURE

CROSS-REFERENCES TO RELATED APPLICATIONS

This application is a divisional of U.S. patent application Ser. No. 14/970,881, filed on Dec. 16, 2015, which claims the priority of Chinese patent application No. 201410820226.6, filed on Dec. 19, 2014, the entirety of all of which is incorporated herein by reference.

FIELD OF THE INVENTION

The present invention generally relates to the field of semiconductor manufacturing and, more particularly, relates to semiconductor structures and fabrication processes thereof.

BACKGROUND

With the continuous development of the integrated circuit (IC) manufacturing technology, the critical dimension of MOS transistors has become smaller and smaller. To reduce the parasitic capacitance of the gates of the MOS transistors; and to increase device speed, a stacked gate structure with a high dielectric constant (high-K) gate dielectric layer and a metal gate, i.e., a high-K metal gate (HKMG) structure, has been applied in the MOS transistors. To prevent the metal material of the metal gate of the HKMG structure from affecting other structures of the MOS transistors, a gate-last process is often used to form the HKMG structure.

The gate-last process for forming the HKMG structure includes providing a semiconductor substrate; and forming a dummy gate structure on the semiconductor substrate. The dummy gate structure includes a gate dielectric layer formed on the semiconductor substrate and a dummy gate formed on the gate dielectric layer; and source/drain regions are formed in the semiconductor substrate at both sides of the dummy gate structure. Further, the gate-last process also includes forming a first dielectric material layer covering the dummy gate structure on the semiconductor substrate; and planarizing the first dielectric material layer by a chemical mechanical polishing (CMP) process using the top surface of the dummy gate structure as a stop layer to form a first dielectric layer. The top surface of the first dielectric layer levels with the top surface of the dummy gate structure.

Further, the gate-last process also includes removing the dummy gate structure to form a trench; and forming a high-K material layer on the side and bottom surfaces of the trench and the surface of the first dielectric layer. Further, the gate-last process also includes forming a metal layer on the high-K material layer; and removing portions of the high-K material and the metal layer on the first dielectric layer to form a high-K gate dielectric layer on the side and bottom surfaces of the trench, and a metal gate layer on the high-K gate dielectric layer and in trench.

Further, the gate-last process also includes forming a second dielectric layer on the metal gate layer, the high-K gate dielectric layer and the first dielectric layer; and etching the second dielectric layer and the first dielectric layer to form a first through-hole to expose the surface of the source region or the drain region; and etching the second dielectric layer to form a second through-hole to expose the surface of the metal gate layer. Further, the gate-last process also includes filling a metal material in the first through-hole to form a first conducive via; and filling a metal material in the second through-hole to form a second conductive via.

However, the reliability and the stability of the fabrication process of the HKMG structure may need further improvements. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having a surface; and forming a metal gate structure on the surface of the substrate. The method also includes forming a first dielectric layer covering a side surface of the metal gate structure on the surface of the semiconductor substrate; and forming a cap layer on a top surface of the metal gate structure. Further, the method includes etching a top portion of the first dielectric layer with a predetermined thickness using the cap layer as an etching mask; and forming a protective sidewall spacer on a side surface of the cap layer and a side surface of a portion of the first dielectric layer under the cap layer. Further, the method also includes forming a second dielectric layer to cover the cap layer, the protective sidewall spacer and a top surface of the etched first dielectric layer; and forming at least one first through-hole exposing one of the source region and the drain region in the second dielectric layer and the first dielectric layer; and forming a first conductive via in the first through-hole.

Another aspect of the present disclosure includes a semiconductor structure. The semiconductor structure includes a semiconductor substrate having a metal gate structure formed on a surface of the semiconductor substrate; and source/drain regions formed in the semiconductor substrate at both sides of the metal gate structure. The semiconductor structure also includes a first dielectric layer, a portion of a top surface of which is lower than a top surface of the metal gate structure, covering the metal gate structure and the semiconductor substrate; and a cap layer formed on the top surface of the metal gate structure and a portion of the first dielectric layer. Further, the semiconductor structure includes a protective sidewall spacer formed on a side surface of the cap layer and a side surface of the portion of the first dielectric layer covered by the cap layer; and a second dielectric layer covering the cap layer, the protective sidewall spacer and the first dielectric layer; and at least a first conductive via formed in the second dielectric layer and the first dielectric layer and on one of the source region and a drain region.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As mentioned previously, the reliability and the stability of the existing fabrication process of a HKMG structure may need further improvements. With the continuous shrinking of the critical dimension of semiconductor devices, during the process for forming the first through-hole, a position shift may be generated in the photolithography overlay. The position shift may cause a position error between the actual position of the first through-hole and the designed positions of the first through-hole.

For example, the first through-hole may expose both the surface of the source region (or the drain region) and the edge region of the top surface of the metal gate layer. After forming the metal via in the first through-hole, the metal via may bridge the metal gate and the source region (or the drain region). Further, when the first through-hole and the second through-hole are formed, because the depth of the first through-hole and the depth of the second through-hole may be different, the second through-hole may expose the surface of the metal gate layer firstly during the etching process. Thus, the etching process for continuously etching the first dielectric layer to form the first through hole may damage the surface of the metal gate layer.

Figure 9:
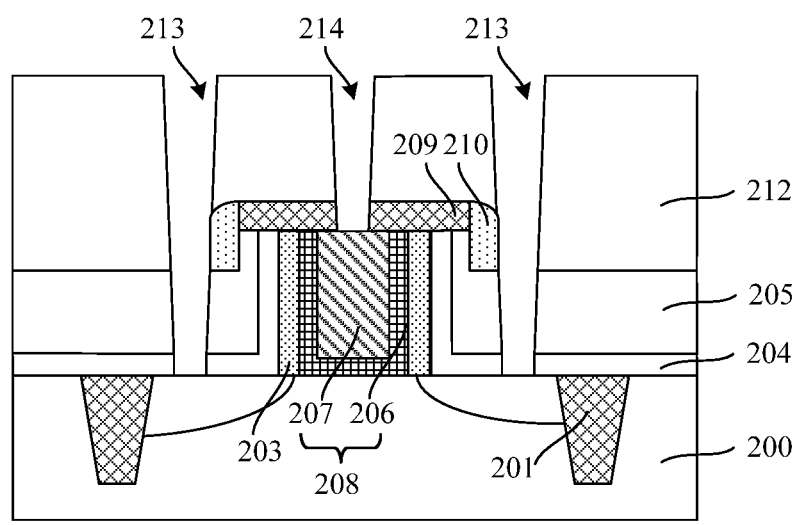
Figure 10:
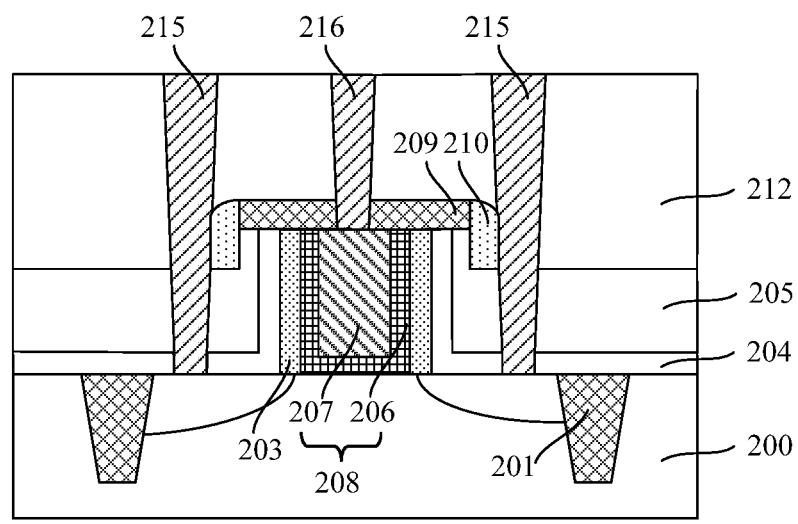
Figure 11:
FIG. 11 illustrates an exemplary fabrication process of a semiconductor structure consistent with the disclosed embodiments.

FIG. 11 illustrates an exemplary fabrication process of a semiconductor structure consistent with the disclosed embodiments; and FIGS. 1~10 illustrate semiconductor structures corresponding to certain stages of the exemplary fabrication process.

Figure 1:
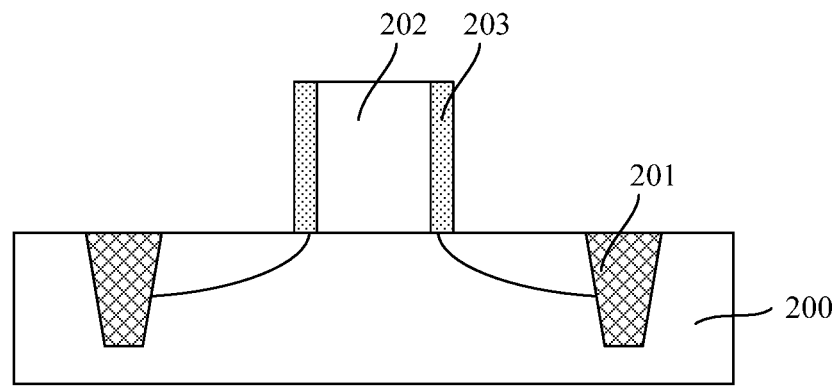
FIGS. 1~10 illustrate structures corresponding to certain stages of an exemplary fabrication process of a semiconductor structure consistent with the disclosed embodiments.

As show in FIG. 11, at the beginning of the fabrication process, a substrate with certain structures is provided (S101). FIG. 1 illustrates a corresponding semiconductor structure.

As shown in FIG. 1, a semiconductor substrate 200 in provided; and a dummy gate structure 202 may be formed on a surface of the semiconductor substrate 200. Further, a gate sidewall spacer 203 may be formed on the side surface of the dummy gate structure 202; and shallow trench isolation (STI) structures 201 may be formed in the semiconductor substrate 200.

The semiconductor substrate 200 may be made of any appropriate semiconductor materials, such as single crystal silicon, polysilicon, silicon on insulator (SOI), germanium on insulator (GOI), silicon germanium, carborundum, indium antimonite, lead telluride, indium arsenide, indium phosphide, gallium arsenide, gallium antimonite, alloy semiconductor or a combination thereof. Certain types of ions may be doped into the semiconductor substrate 200 to modify the electric parameters of the semiconductor substrate 200. The semiconductor substrate 200 provides a base for subsequent devices and processes.

The STI structures 201 may be used to insulate adjacent active regions; and to prevent electrical connections between adjacent transistors formed on different active regions. The STI structures 201 may be single-layer structures, or multiple-layer structures. In one embodiment, when the STI structures 201 are single-layer structures, the STI structures 201 may be made of one or more of silicon oxide, silicon nitride, and silicon oxynitride, etc. In certain other embodiments, when the STI structure 201 are double-layer structures, the STI structures 201 may include a padding oxide layer and a filling layer formed on the padding oxide layer.

The dummy gate structure 202 may be used as a sacrificial structure for subsequently forming a metal gate structure. The number of the dummy gate structure 202 may be at least one. The dummy gate structure 202 may be made of any appropriate material, such as polysilicon, or amorphous carbon, etc.

A process forming the dummy gate structure 202 may include forming a dummy gate material layer on the surface of the semiconductor substrate 200; forming a patterned mask layer on the dummy gate material layer; and etching the dummy gate material layer using the patterned mask layer as an etching mask. Thus, the dummy gate structure 202 may be formed on the surface of the semiconductor substrate 200.

Optionally, an interface layer (not shown) may be formed between the dummy gate structure 202 and the semiconductor substrate 200. The interface layer may be of silicon oxide, etc.

The gate sidewall spacer 203 may be a single-layer structure, or a multiple-layer structure. In one embodiment, the gate sidewall spacer 203 is a double-layer structure including a shift sidewall spacer (not labeled) formed on the side surface of the dummy gate structure 202, and a main sidewall spacer (not labeled) formed on the drift sidewall spacer.

The shift sidewall spacer may be made of any appropriate material, such as silicon oxide, etc. Various processes may be used to form the shift sidewall spacer, such as a chemical vapor deposition (CVD) process, a physical vapor deposition (PVD) process, an atomic layer deposition (ALD) process, a flowable CVD (FCVD) process, or a thermal oxidation process, etc.

The main sidewall spacer may be made of any appropriate material, such as silicon nitride, etc. Various processes may be used to form the main sidewall spacer, such as a CVD process, a PVD process, an ALD process, or an FCVD process. An etching process may also be used to form the main sidewall spacer.

Referring to FIG. 1, the shift sidewall spacer may be formed on the side surface of the dummy gate structure 202 firstly. After forming the shift sidewall spacer, an ion implantation process may be performed on the semiconductor substrate 200 using the shift sidewall spacer and the dummy gate structure 202 as a mask. Thus, lightly-doped drain (LDD) regions (not labeled) may be formed in the semiconductor substrate 200 at both sides of the dummy gate structure 202 and the shift sidewall spacer.

After forming the LLD regions, the main sidewall spacer may be formed on the side surface of the shift sidewall spacer. A process for forming the main sidewall spacer may include forming a main sidewall spacer material layer covering the dummy gate structure 202 and the shift sidewall spacer on the surface of the semiconductor substrate 200; and followed by etching the main sidewall spacer material layer by a mask-less etching process. Thus, the main sidewall spacer may be formed on the side surface of the shift sidewall spacer. The main sidewall spacer may also be a single-layer structure, or a multiple-layer structure.

After forming the main sidewall spacer, a second ion implanting process may be performed on the semiconductor substrate 200 using the main sidewall spacer and the dummy gate structure 202 as a mask. Thus, heavily-doped regions (not labeled) may be formed in the semiconductor substrate 200 at both sides of the dummy gate structure 200 and the main sidewall spacer. The heavily-doped regions and the LDD regions may form a source region (not labeled) and a drain region (not labeled) of a transistor in the semiconductor substrate 200 at both sides of the dummy gate structure 202.

The type of the doping ions of the first ion implantation process and the type of the doping ions of the second ion implantation process may be identical. The doping ions may be N-type doping ions, or P-type doping ions. The N-type doping ions may include phosphor ions, arsenic ions, or antimony ions, etc. The P-type doping ions may include boron ions, gallium ions, or indium ions, etc.

The type of the doping ions of the first ion implantation process and the second ion implantation process may be selected according to the type of the transistor. When the transistor is an N-type transistor, the doping ions of the first ion implantation process and the second ion implantation process may be N-type ions. When the transistor is a P-type transistor, the doping ions of the first ion implantation process and the second ion implantation process may be P-type ions.

In certain other embodiments, after forming the dummy gate structure 202 and the gate sidewall spacer 203, trenches may be formed in the semiconductor substrate 200 at both sides of the dummy gate structure 202 by etching the semiconductor substrate 200 using the dummy gate structure 202 and the gate sidewall spacer 203 as an etching mask. Then, a stress layer may be filled in the trenches to form a stressed source region and a stressed drain region. The stress layer may be made of silicon germanium, or silicon carbide, etc.

In certain other embodiments, a high-K dielectric layer may be formed on the semiconductor substrate 200; and a dummy gate structure may be formed on the high-K dielectric layer. After subsequently removing the dummy gate structure, a metal gate electrode may be formed on the corresponding position of the dummy gate structure on the high-K dielectric layer.

Figure 2:
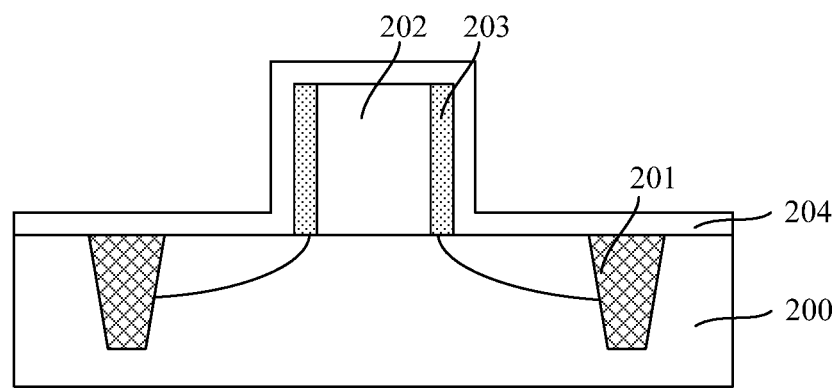

Returning to FIG. 11, after providing the semiconductor substrate 200; and forming the dummy gate structure 202, an etching stop layer may be formed (S102). FIG. 2 illustrates a corresponding semiconductor structure.

As shown in FIG. 2, an etching stop layer 204 is formed on the semiconductor substrate 200. The etching stop layer 204 may also cover the surface of the gate sidewall spacer 203 and the top surface of the dummy gate structure 202.

The etching stop layer 204 may be made of any appropriate material, such as silicon oxide, silicon nitride, or silicon oxynitride, etc. Various processes may be used to form the etching stop layer 204, such as a CVD process, a PVD process, an ALD process, or an FCVD process, etc.

Figure 3:
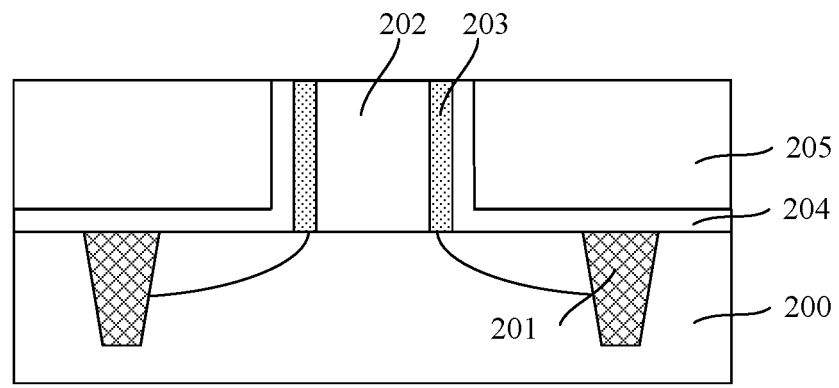

Returning to FIG. 11, after forming the etching stop layer 204, a first dielectric layer may be formed (S103). FIG. 3 illustrates a corresponding semiconductor structure.

As show in FIG. 3, a first dielectric layer 205 is formed on the surface of the etching stop layer 204. The top surface of the first dielectric layer 205 may level with the top surface of the dummy gate structure 202.

A process for forming the first dielectric layer 205 may include forming a first dielectric material layer on the etching stop layer 204; and followed by planarizing the first dielectric material layer until the top surface of the dummy gate structure 202 is exposed. Thus, the first dielectric layer 205 may be formed; and the portion of the etching stop layer 204 on the top surface of the dummy gate structure 202 is removed.

The first dielectric material layer may be made of any appropriate material, such as silicon oxide, silicon nitride, silicon oxynitride, or low-dielectric constant material, etc. In one embodiment, the first dielectric material layer is made of silicon oxide.

Various processes may be used to form the first dielectric material layer, such as a CVD process, a PVD process, an ALD process, or an FCVD process, etc. The first dielectric material layer may be planarized by any appropriate process, such as a CMP process, etc.

Figure 4:
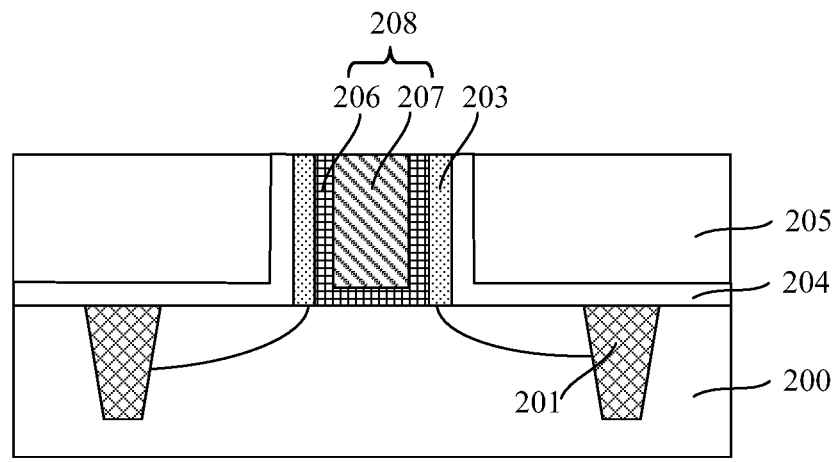

Returning to FIG. 11, after forming the first dielectric layer 205, a metal gate structure may be formed (S104). FIG. 4 illustrates a corresponding semiconductor structure.

As shown in FIG. 4, the dummy gate structure 202 is removed; and a metal gate structure 208 is formed in the first dielectric layer 205 and on the surface of the semiconductor substrate 200. The metal gate structure 208 may include a high-K dielectric layer 206 and a metal gate electrode 207 on the high-K dielectric layer 206. Thus, the metal gate structure 208 may be referred as an HKMG structure.

The dummy gate structure 202 may be removed by any appropriate process, such as a dry etching process, a wet etching process, or a combination of a dry etching process and a wet etching process, etc. In one embodiment, the dummy gate structure 202 is removed by a wet etching process. The etching solution of the wet etching process may include KOH, tetramethylammonium hydroxide (TMAH), and $NH_3.H_2O$, etc. After removing the dummy gate structure 202, a trench (not labeled) may be formed.

A process for forming the metal gate structure 208 may include forming a high-K dielectric material layer on the side and bottom surfaces of the trench; forming a metal material layer on the high-K dielectric material layer; and removing portions of the high-K dielectric material layer and the metal material on the top surface of the first dielectric layer 205. Thus, the high-K dielectric layer 206 may be formed on the side and bottom surfaces of the trench; and the metal gate electrode 207 may be formed on the high-K dielectric layer 206.

The high-K dielectric layer 206 may be made of any appropriate material, such as $HfO_2$, $TiO_2$, HfZrO, HfSiNO, $Ta_2O_5$, $ZrO_2$, $ZrSiO_2$, $Al_2O_3$, $SrTiO_3$, or $BaSrTiO_3$, etc. The metal gate electrode 209 may be made of any appropriate material, such as W, Al, Cu, Ti, Ag, Au, Pt, or Ni, etc.

In certain other embodiments, a work function layer may be formed between the metal gate electrode and the high-K dielectric layer. The work function layer may be used to adjust the work function of the transistor. The work function layer may be made of any appropriate material, such as one or more of Ti, Ta, TiN, TaN, TiAl, TaC, TaSiN, and TaAlN, etc.

Figure 5:
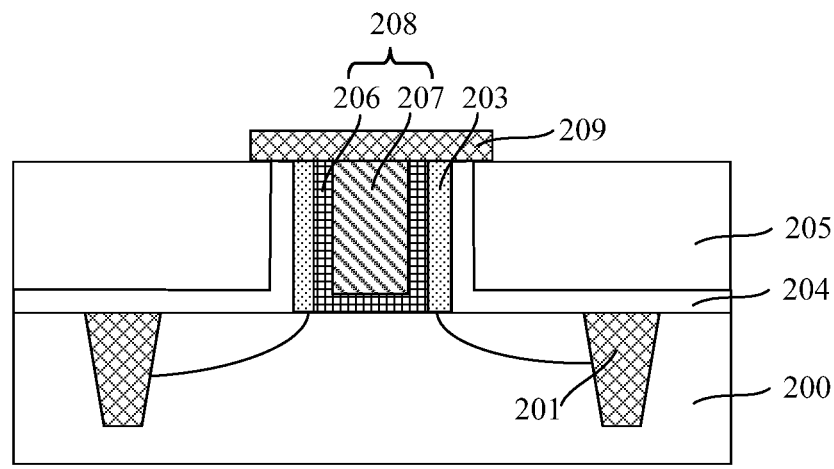

Returning to FIG. 11, after forming the metal gate structure 208, a cap layer may be formed (S015). FIG. 5 illustrates a corresponding semiconductor structure.

As shown in FIG. 5, a cap layer 209 is formed on the top surface of the metal gate structure 208. The width of the cap layer 209 may be greater than the width of the metal gate structure 20. That is, the cap layer 209 may also cover the gate sidewall spacer 203, the top surface of the etching stop layer 204, and a portion of the top surface of the first dielectric layer 205.

The cap layer 209 may be used to control the height of the subsequently formed protective sidewall spacer; and may reduce the difficulties for forming the protective sidewall spacer by a mask-less etching process. Further, when first through-holes and a second through-hole are subsequently formed by a same etching process, the cap layer 209 may be used as an etching stop layer for forming the second through-hole in a subsequently formed second dielectric layer. Such an etching stop layer may prevent the surface damages caused by continuously etching the first dielectric layer 205 to form the first through-holes.

Further, the cap layer 209 and the subsequently formed protective sidewall spacer may form a protective layer. The protective layer may cover the top surface of the metal gate structure 208 and the top portion of the side surface of the metal gate structure 208. When the first through-holes and the second through-hole are subsequently formed in the first dielectric layer 205 and the second dielectric layer, even an overlay drift occurs, the cap layer 209 and the protective sidewall spacer may be able to prevent the first through-holes from exposing the edge of the top surface of the metal gate structure 208; and the bridging issue may be avoided.

The cap layer 209 may be made of a material different from the first dielectric layer 205 and the subsequently formed second dielectric layer. Further, the cap layer 209 may be a single-layer structure, or a multiple-layer structure.

In one embodiment, the cap layer 209 may be made of one or more of silicon nitride, silicon oxynitride, silicon carbonitride, and silicon carbide, etc. The thickness of the cap layer 209 may be in a range of approximately 100 Å~300 Å.

Figure 6:
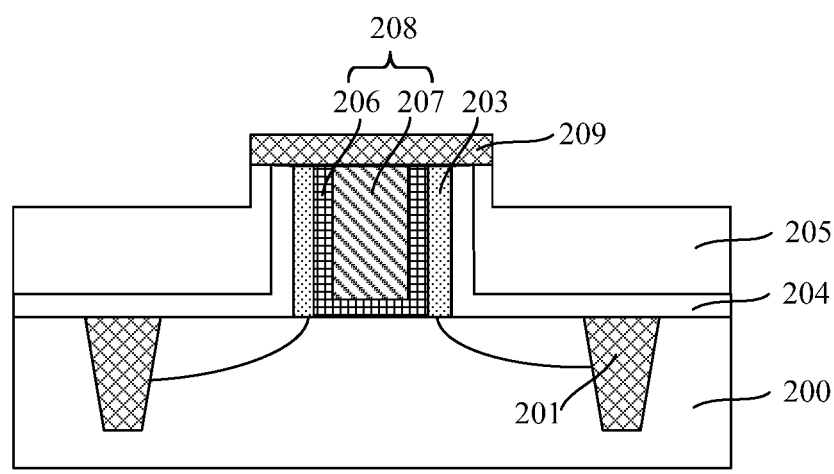

Returning to FIG. 11, after forming the cap layer 209, a portion of the first dielectric layer 205 may be recessed (S106). FIG. 6 illustrates a corresponding semiconductor structure.

As shown in FIG. 6, a portion of the first dielectric layer 205 may be recessed. That is, the first dielectric layer 205 may be etched back using the cap layer 209 as an etching mask; and the top surface of the recessed portion of the first dielectric layer 205 may be lower than the top surface of the cap layer 209. Recessing the portion of the first dielectric layer 205 may aid subsequently forming a protective sidewall spacer.

The portion of the first dielectric layer may be etched by any appropriate process, such as a dry etching process, or a wet etching process, etc. The thickness of the portion of the first dielectric layer 205 etched away may be in a range of approximately 200 Å~500 Å. In one embodiment, the portion of the dielectric layer 205 covered by the cap layer 209 may be kept during process for recessing the portion of the first dielectric layer 205.

Figure 7:
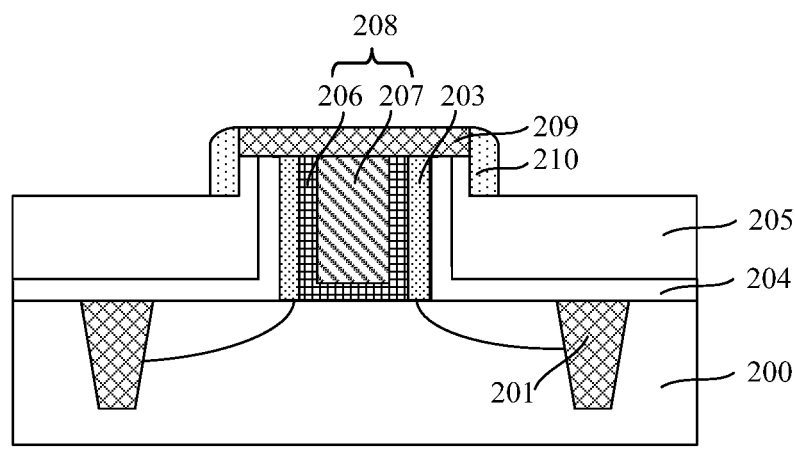

Returning to FIG. 11, after recessing the portion of the first dielectric layer 205, a protective sidewall spacer may be formed (S107). FIG. 7 illustrates a corresponding semiconductor structure.

As shown in FIG. 7, a protective sidewall spacer 210 is formed on the side surface of the cap layer 209 and the side surface of the portion of first dielectric layer 205 under the cap layer 209. Thus, the metal gate structure 208 may be entirely covered by the cap layer 209 and the protective sidewall spacer 210. The protective sidewall spacer 210 may be made of a material identical to the material of the first dielectric layer 205.

A process for forming the protective sidewall spacer 210 may include forming a protective sidewall spacer material layer to cover the cap layer 209, the side surface of the portion of the first dielectric layer 205 under the cap layer 209; and the recessed surface of the first dielectric layer 205; and performing a mask-less etching process on the protective sidewall spacer material layer. Thus, the protective sidewall spacer 210 may be formed on the side surface of the cap layer 209 and the side surface of the portion of the first dielectric layer 205 under the cap layer 209. The thickness of the protective sidewall spacer 210 may be in a range of approximately 50 Å~150 Å.

The protective sidewall spacer 210 may be made of any appropriate material, such as silicon nitride, silicon oxynitride, silicon carbonitride, or silicon carbide, etc. In one embodiment, the protective sidewall spacer 210 is made of silicon nitride.

Various processes may be used to form the protective sidewall spacer material layer, such as a CVD process, a PVD process, an ALD process, or an FCVD process, etc. The mask-less etching process may be any appropriate etching process. In one embodiment, the mask-less etching process is a plasma etching process.

Figure 8:
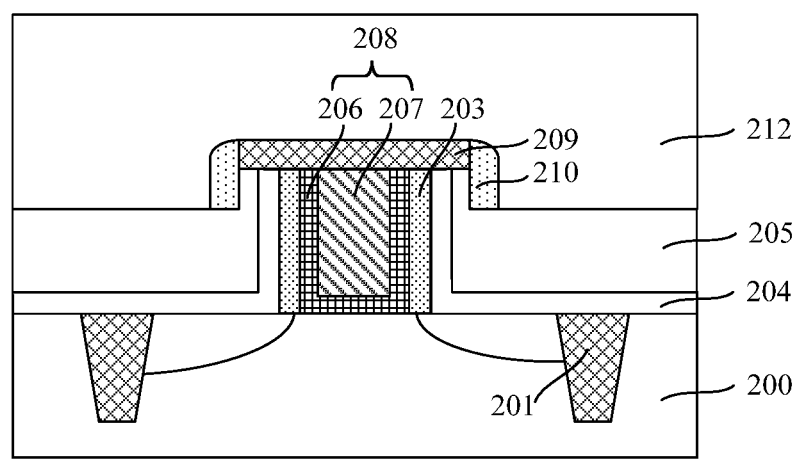

Returning to FIG. 11, after forming the protective sidewall spacer 210, a second dielectric layer may be formed (S108). FIG. 8 illustrates a corresponding semiconductor structure.

As shown in FIG. 8, a second dielectric layer 212 is formed on the recessed surface of the first dielectric layer 205. The second dielectric layer 212 may also cover the cap layer 209 and the protective sidewall spacer 210.

The second dielectric layer 212 may be made of any appropriate material, such as silicon oxide, silicon nitride, silicon oxynitride, or silicon carbide, etc. Various processes may be used to form the second dielectric layer 212, such as a CVD process, a PVD process, an ALD process, or an FCVD process, etc.

Returning to FIG. 11, after forming the second dielectric layer 212, at least first through hole may be formed (S109). FIG. 9 illustrates a corresponding semiconductor structure.

As shown in FIG. 9, in one embodiment, two first through-holes 213 are formed in the second dielectric layer 212 and the first dielectric layer 205. In certain other embodiments, only one through-hole 213 may be formed in the second dielectric layer 212 and the first dielectric layer 205.

The first through holes 213 may penetrating through second dielectric layer 212 and the first dielectric layer 205. In one embodiment, one of the first through holes 213 may expose the surface of the source region; and one of the first through-holes 213 may expose the surface of the drain region. Further, a second through-hole 214 may be formed in the second dielectric layer 212 and the cap layer 209. The second through-hole 214 may penetrating through the second dielectric layer 212 and the cap layer 209; and may expose the top surface of the metal gate structure 208.

The first through-holes 213 may be formed by etching the second dielectric layer 212, the first dielectric layer 205 and the etching stop layer 204. The second dielectric layer 212, the first dielectric layer 205, and the etching stop layer 204 may be etched by any appropriate process, such as a dry etching process, a wet etching process, or an ion beam etching process. In one embodiment, the second dielectric layer 212, the first dielectric layer 205, and the etching stop layer 204 are etched by an anisotropic dry etching process. The anisotropic dry etching process may be a plasma etching process. The etching process may be performed to expose the etching stop layer 204 firstly; and then the etching process may be continued to remove the etching stop layer 204. By doing so, the damages to the top surfaces of the source region and the top surface of the drain region may be reduced.

The protective sidewall spacer 210 and the cap layer 209 may be made of a material different from the material of the first dielectric layer 205 and the second dielectric layer 212. During the process for forming the first through-holes 213, the first dielectric layer 205 and the second dielectric layer 212 may have a significantly high etching selectivity with the material of the protective sidewall spacer 210 and the cap layer 209. Even the first through-holes 213 have a certain degree of offset from the designed position, for example, the first through-holes 213 shift close to the metal gate structure 208, the protective sidewall spacer 210 and the cap layer 209 may prevent the first through-holes 213 from exposing the top surface and a portion of the side surface of the metal gate structure 208. Thus, the bridging effect may be prevented. In one embodiment, as shown in FIG. 9, the first through-holes 210 may expose the side surface of the protective sidewall spacer 210.

The etching process for forming the first through-holes 209 may also be able to etch the second dielectric layer 212 and the cap layer 209 on the top surface of the metal gate structure 208 simultaneously to form the second through-hole 214. The second through-hole 214 may expose the top surface of the metal gate structure 208. In certain other embodiments, the first through-holes 213 and the second through-hole 214 may be formed by separated processes.

Referring to FIG. 9, the depth of the first through-holes 213 may be greater than the depth of the second through-hole 214. Thus, it may take longer to form the first through-holes 213 than to form the second through-hole 214 when a same etching process is performed. That is, when the portion of the second through-hole 214 in the second dielectric layer 212 is formed, the etching process may need to be continued to form the entire first through-holes 213. Because the cap layer 209 may be made of a material different from that of the first dielectric layer 205 and the second dielectric layer 212, the cap layer 209 may protect the top surface of the metal gate structure 208 when the etching process is being continued.

Returning to FIG. 11, after forming the first through-holes 213 and the second through hole 214, first conducive vias and a second conductive via may be formed (S110). FIG. 10 illustrates a corresponding semiconductor structure.

As shown in FIG. 10, a first conductive via 215 is formed in each of the first through-holes 213; and a second conductive via 216 is formed in the second through-hole 214. The first conductive vias 215 and the second conductive via 216 may be formed by filling a metal material in the first through holes 213 and the second through-hole 214.

Specifically, a process for forming the first conductive vias 215 and the second conductive via 216 may include forming a second metal layer to cover the second dielectric layer 212 and fill the first through-holes 213 and the second through-hole 214; and followed by planarizing the second metal layer until the top surface of the second dielectric layer 212 is exposed. Thus, the first conductive vias 215 and the second conductive via 216 may be formed.

The first conductive vias 215 and the second conductive via 216 may be made of any appropriate material, such as W, or Al, etc. Various processes may be used to form the second metal layer, such as a CVD process, a PVD process, a sputtering process, or an electroplating process, etc.

In certain other embodiments, the first conductive vias and the second conducive vias may be formed by separated processes. The first conductive vias and the second conductive vias may be made of a same material, or different materials.

Thus, a semiconductor structure may be formed by the above disclosed processes and methods; and the corresponding semiconductor structure is illustrated in FIG. 10. As shown in FIG. 10, the semiconductor structure includes a semiconductor substrate 200; and a metal gate structure 208 formed on the semiconductor substrate 200. A source region (not labeled) and a drain region (not labeled) of a transistor may be formed in the semiconductor substrate 200 at both sides of the metal gate structure 208.

The semiconductor structure may also include a first dielectric layer 205 covering the semiconductor substrate 200 and the metal gate structure 208, a portion of the top surface of which is lower than the top surface of the metal gate structure 208. Further, the semiconductor structure may also include a cap layer 209 formed on the top surface of the metal gate structure 208; and a protective sidewall spacer 210 formed on the side surface of the cap layer 209 and the side surface of a portion of the first dielectric layer under the cap layer 209.

Further, the semiconductor structure may also include a second dielectric layer 212 covering the cap layer 209, the protective sidewall spacer 210 and the surface of the first dielectric layer 205. Further, the semiconductor structure may also include first conductive vias 215 formed in the first dielectric layer 205 and the second dielectric layer 212 and on the source region and the drain region; and a second conductive via 216 formed in the second dielectric layer 212 and on the metal gate structure 208. The detailed structures and intermediate structures are described above with respect to the fabrication processes.

According to the disclosed methods and structures, after forming a metal gate structure and a first dielectric layer, a cap layer may be formed to cover the top surface of the metal gate structure. Then, a portion of the first dielectric layer may be recessed using the cap layer and the metal gate structure as a mask. Then, a protective sidewall spacer may be formed on the side surface of the cap layer and the side surface of the portion of the first dielectric layer under the cap layer. The protective sidewall spacer may be made of a material different from the material of the first dielectric layer. The protective sidewall spacer and the cap layer may cover the top surface and the side surface of the metal gate structure. After forming a second dielectric layer, first through-holes may be formed in the first dielectric layer and the second dielectric layer. Even if the positions of the first through-holes shift close to the metal gate structure, the protective sidewall spacer and the cap layer may be used as an etching stop layer to prevent the first through-holes from exposing the top surface of the metal gate structure. Further, the cap layer may be used as an etching stop layer to protect the top surface of the metal gate structure during the process for forming the first through-hole. Thus, the bridging effect between the metal structure and the source/drain regions may be prevented.

Further, it may be unnecessary to change the process for forming the metal gate structure and the processes before forming the metal gate structure to form the cap layer and the protective sidewall spacer. Thus, the process for forming the semiconductor structure may be relatively simple; and the production cost may be reduced.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a semiconductor substrate having a metal gate structure formed on a surface of the semiconductor substrate;
   source/drain regions formed in the semiconductor substrate at both sides of the metal gate structure;

a first dielectric layer, a portion of a top surface of which is lower than a top surface of the metal gate structure, covering the metal gate structure and the semiconductor substrate;

a cap layer formed on the top surface of the metal gate structure and a portion of the first dielectric layer;

a protective sidewall spacer having a sidewall with a first portion covering a side surface of the cap layer and a second portion covering a side surface of a portion of the first dielectric layer covered by the cap layer;

a second dielectric layer covering the cap layer, the protective sidewall spacer and the first dielectric layer; and at least a first conductive via formed in the second dielectric layer and the first dielectric layer and on one of the source region and the drain region.

2. The semiconductor structure according to claim 1, wherein:

a width of the cap layer is greater than a width of the metal gate structure.

3. The semiconductor structure according to claim 1, wherein:

the portion of the top surface of the first dielectric layer is lower than the top surface of the metal gate structure in a range approximately 200 Å~500 Å.

4. The semiconductor structure according to claim 1, wherein:

a thickness of the protective sidewall spacer is in a range of approximately 50 Å~150 Å.

5. The semiconductor device according to claim 1, wherein:

the first dielectric layer is made of one of silicon oxide and low dielectric constant material; and the protective sidewall spacer and the cap layer is made of one of silicon oxide, silicon oxynitride, silicon oxynitride, silicon carbonitride, and silicon carbide.

6. The semiconductor device according to claim 1, wherein the metal gate structure further comprises:

a high-K dielectric layer formed on the surface of the semiconductor substrate; and a metal gate electrode formed on the high-K dielectric layer.

* * * * *